United States Patent [19]

Masuda et al.

[11] Patent Number: 4,649,381
[45] Date of Patent: Mar. 10, 1987

[54] LIQUID CRYSTAL PANEL DISPLAY DEVICE

[75] Inventors: Mitsuhiro Masuda; Osamu Igarashi; Keiichi Tokuyama; Kozo Katogi, all of Katsuta, Japan

[73] Assignee: Hitachi, Ltd., Tokyo, Japan

[21] Appl. No.: 664,772

[22] Filed: Oct. 25, 1984

[30] Foreign Application Priority Data

Oct. 28, 1983 [JP] Japan ................. 58-202206

[51] Int. Cl.⁴ .............................................. G09G 3/36
[52] U.S. Cl. ..................................... 340/784; 340/760; 340/718; 350/345
[58] Field of Search ............... 340/716, 719, 753, 760, 340/763, 765, 780, 784, 815.06, 815.07; 350/345

[56] References Cited

U.S. PATENT DOCUMENTS

| | | | |
|---|---|---|---|
| 4,139,272 | 2/1979 | Laesser et al. | 350/345 X |
| 4,238,793 | 12/1980 | Hochstrate | 340/716 X |
| 4,330,813 | 5/1982 | Deutsch | 340/784 X |
| 4,519,679 | 5/1985 | Horikiri et al. | 350/345 X |
| 4,573,766 | 3/1986 | Bournay, Jr. et al. | 340/716 X |

Primary Examiner—Gerald L. Brigance
Assistant Examiner—Vincent P. Kovalick
Attorney, Agent, or Firm—Antonelli, Terry & Wands

[57] ABSTRACT

A liquid crystal panel device comprises a liquid crystal panel having a relatively large area particularly while in use with an automobile dashboard and having a plurality of display sections, a diffusion plate disposed opposing the rear face of the liquid crystal panel for diffusing receiving light rays, a printed circuit board disposed opposing the rear face of the diffusion plate, and a plurality of light emitting members disposed in equally spaced relation to each other on the printed circuit board over the whole region of the liquid crystal panel. A reflection plate is provided between the diffusion plate and the board, and a partition plate corresponding to the display section of the liquid crystal panel is provided. Within a space defined by the diffusion plate, board, reflection plate, and partition plate, the light emitting members consisting of three or four incandescent lamps are disposed.

4 Claims, 3 Drawing Figures

LIQUID CRYSTAL PANEL DISPLAY DEVICE

The present invention relates to a liquid crystal panel display device, and more particularly relates to a liquid crystal panel display device for use with a vehicle instrument panel in which the liquid crystal panel is relatively large and of a transmission type and a plurality of display blocks are provided on the liquid crystal panel.

A liquid crystal panel used for a vehicle instrument panel particularly for a dashboard of an automobile is generally of a transmission type because it is necessary to make it easier to see. Further, since various driving conditions have to be displayed, a large single piece of liquid crystal panel has been used which is divided into a plurality of display blocks for displaying respective various driving conditions.

As one example of a liquid crystal display device for an automobile dashboard, a liquid crystal display type instrument panel is disclosed in Japanese Utility Model Application Laid-open No. 46268/80. The liquid crystal display panel is illuminated from its rear face by means of a lamp and an illumination plate provided at the side of the liquid crystal. In this case, however, it is difficult to uniformly illuminate the whole surface of the liquid crystal due to attenuation at the illumination panel and the like. In particular, a large area type liquid crystal panel has inevitably a problem that the central part of the panel becomes dark.

Other than the illumination arrangement described above, there is known in the art a means for directly illuminating the rear face of the liquid crystal panel by disposing a light source at the rear face. The means has been found, however, not satisfactory in that only the portion corresponding to the central part of illumination is lightened up extraordinarily, and even if light is diffused with a diffusion plate, there is still unevenness in brightness. The above direct illumination method is effective, however, for other display devices except those for a vehicle. In this case, since there is a sufficient distance from a light source to a display panel, a natural diffusion can be expected. On the other hand, it is required for the display device of a vehicle to make the thickness of the device itself thinner. As a result, there arises a problem that it is difficult in view of restricted space to obtain a sufficient thickness of the device enabling such a natural diffusion.

It is an object of the present invention to eliminate the prior art disadvantages, and it is a more specific object of the present invention to provide a liquid crystal panel display device which can obtain a uniform illumination over the whole surface of the liquid crystal panel even if it is relatively large, thereby making it possible to see with ease.

In accordance with one aspect of the present invention, a liquid crystal panel display device comprises a liquid crystal panel having a relatively large area, a diffusion plate disposed so as to face the rear of the liquid crystal panel, and a plurality of light emitting members disposed so as to face the rear of the diffusion plate, the light emitting members being juxtaposed throughout the whole area of the liquid crystal panel.

The above and other objects, features and advantages of the present invention will be apparent from the following detailed description of the preferred embodiments of the invention in conjunction with the accompanying drawings, in which.

Figure 1:
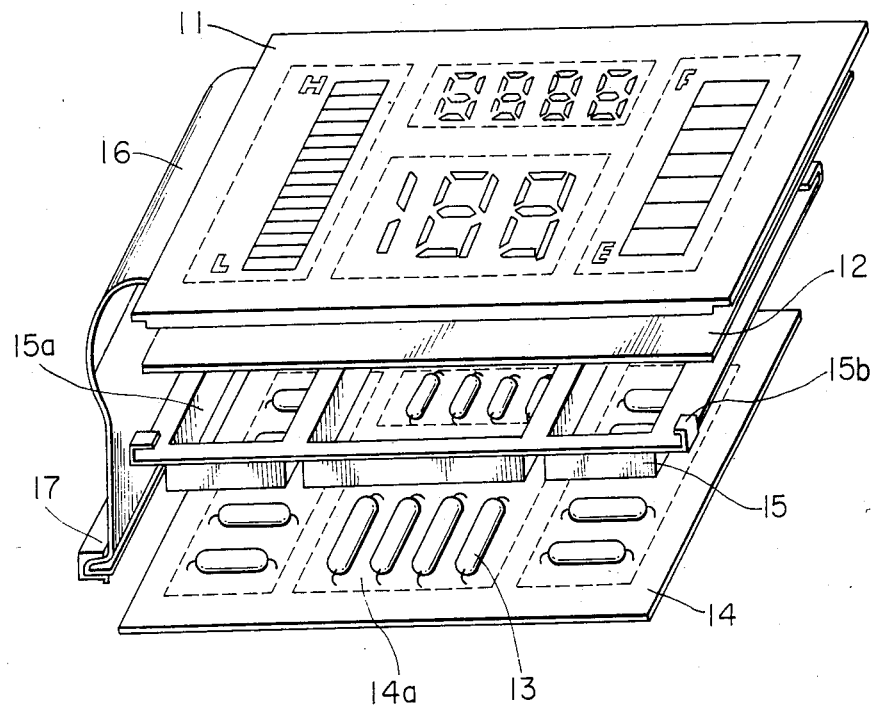
FIG. 1 is a perspective disassembled view of a liquid crystal panel display device in accordance with an embodiment of the present invention.
Figure 2:
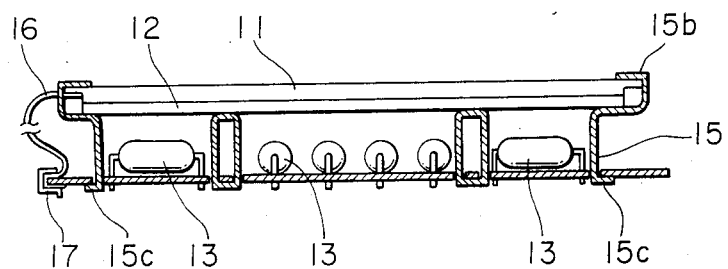
FIG. 2 is a sectional view of the liquid crystal panel display device shown in FIG. 1.

FIG. 1 is a perspective disassembled view of a liquid crystal panel display device in accordance with an embodiment of the present invention, wherein the liquid crystal panel display device is applied to an instrument panel for an automobile. In the figure, there is shown a liquid crystal panel 11 having a relatively large area. On the liquid crystal panel 11, a plurality of display blocks, for example, four in total are formed. The display blocks are provided with respective display portions of, for example, a speedometer, a tachometer, a fuel meter, and a water thermometer. The display portions are separately positioned in the liquid crystal panel 11 as shown in the figure by broken lines. A diffusion plate 12 having generally the same shape and size as those of the liquid crystal panel 11 is disposed such that it faces the rear of the liquid crystal panel 11. Further, a drive circuit printed board 14 having generally the same shape and size as those of the liquid crystal panel 11 is disposed opposing the diffusion plate 12. The surface of the drive circuit printed board 14 opposing the diffusion plate 12 is provided with incandescent lamps 13 of an elongated shape. Each region corresponding to each of the display blocks is provided with, for example, three to four incandescent lamps juxtaposed with each other. The fluorescent lamp may also be used instead of the incandescent lamp 13.

In addition to the above arrangement, between the drive circuit printed board 14 and the diffusion plate 12, a metal or reflection plate fixture 15 is disposed. The metal fixture 15 is made of, for example, aluminum or the like which can increases diffused reflection components of incident light. The metal fixture 15 is of a frame like structure provided with openings at regions thereon corresponding to respective display blocks. An edge of each of the openings which edge corresponds to a periphery of each display block is provided with a vertical wall 15a perpendicular relative to the drive circuit printed board 14. Further, a part of the abutting edges of the metal fixture 15 upon the drive circuit printed board 14 is provided with a hook 15c. The hook 15c is inserted into and bent at an aperture formed in the drive circuit printed board 14. On the other hand, a part of the corner portions of the metal fixture 15 at the liquid crystal panel 11 side is provided with a hook 15b. The hook 15b holds both liquid crystal panel 11 and diffusion panel 12.

It is seen further that a flexible board 16 is extended out of the liquid crystal panel 11 and is connected to the drive circuit printed board 14 through a metal clamp 17. The surface 14a of the drive circuit printed board 14 partitioned by the metal fixture 15 into respective display blocks is colored white, for example, by silk screening.

Figure 3:
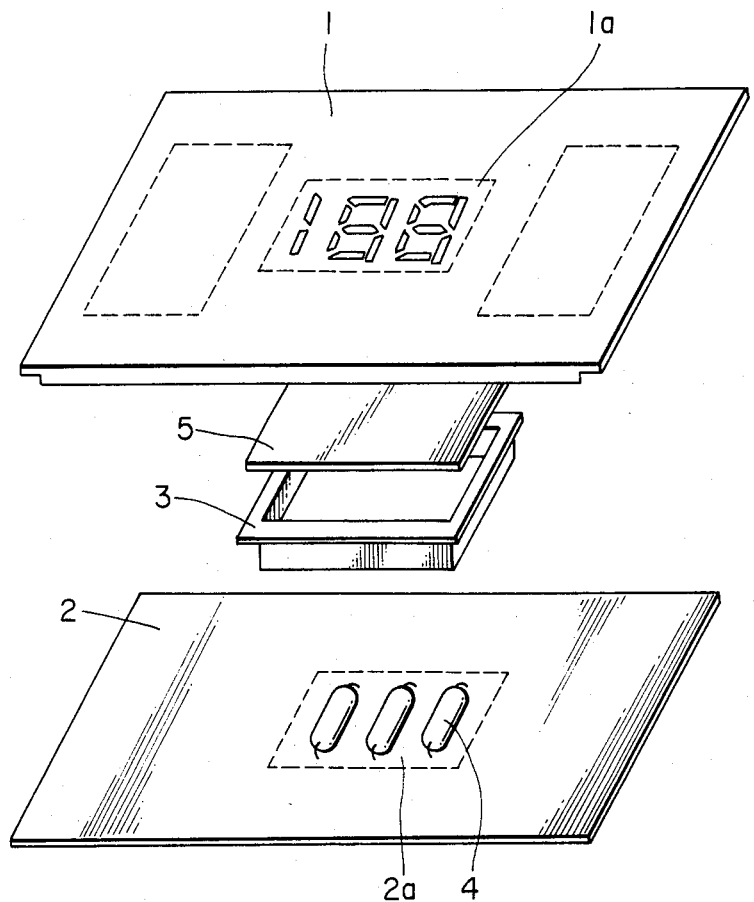
FIG. 3 is an exploded view for illustrating the operation and effects of the present invention.

With the liquid crystal panel display device constructed as above, as shown in FIG. 3, a plurality of elongated incandescent lamps 4 are laid side by side on a section 2a of the drive circut printed board 2, the section 2a being located just below a display block 1a of the liquid crystal panel 1. Since a closed space defined by the drive circuit printed board 2, the liquid crystal panel 1, and the metal fixture 3 which has a function to diffusively reflect lights, is provided, lights from the incandescent lamps 4 are repeatedly reflected within the closed space. Therefore, uniform lights are emitted from the transmission medium within the display block 1a. Moreover, since a light source is provided independently for each display block, there is no possibility that brightness of each display block varies with the layout of the display blocks within the liquid crystal panel 1. In this case, if a reflection mode by the metal fixture serving as a reflection plate is taken into consideration, a rough surface such as of aluminum material is preferable to be utilized as a reflection plate, because a diffused reflection makes illuminating lights upon the liquid crystal panel 1 more uniform than an ordinary reflection, thus preventing the generation of unevenness of brightness. In the case that independent illumination for each display block 1a is performed, since each display block has a plural number of light sources, it is possible to prevent the whole illumination of a particular display block from being disabled due to such as a burnout of the incandescent lamp 4. A diffusion plate 5 is provided between the display block 1a and the metal fixture 3. A temperature rise in the closed space due to heat generation of the incandescent lamp may be considered as one of possible problems of the present invention. However, a moderate heat dissipation can readily be realized if only the metal fixture with a reflection function is made of such as aluminum. It is noted however that the moderate heat dissipation can be dispensed with, because it is rather preferable to heat the liquid crystal within the working temperature range thereof in view of the response characteristic.

As seen from the above, it is possible to make the thickness of the stack comprising the liquid crystal panel 1, the diffusion plate 5, the metal fixture 3 and the drive circuit printed board 2 within about 15 mm. And the whole thickness including a printed circuit board for associated processing circuits, a casing and the like may also be made within about 40 mm. Thus, it is possible to obtain a thin display device.

In the above embodiment, the metal fixture 15 with the frame-like structure has been disposed between the drive circuit printed board 14 and the diffusion plate 12. However, it will be understood that the object of the present invention can readily be attained without providing the metal fixture 15.

Moreover, the display panel has been described as having a plurality of display blocks, however, so far as the display panel is relatively large in area, it will be understood that the display panel is not always required to be divided into a plurality of display blocks.

As seen from the above description, the liquid crystal panel display device according to the present invention can enjoy an advantage that a uniform illumination over the entire surface of the liquid crystal is obtained, even if the liquid crystal panel is relatively large in area.

We claim:

1. A liquid crystal panel display device comprising:
a liquid crystal panel having a relatively large area and having at least two display blocks, said liquid crystal panel having a front face and a rear face;
a diffusion plate having a front face disposed opposing the rear face of said liquid crystal panel for diffusing received light rays, said diffusion plate having a rear face;
a board disposed opposing the rear face of said diffusion plate;
a reflection plate disposed between said diffusion plate and said board for partitioning spaces corresponding to respective ones of said at least two display blocks of said liquid crystal panel; and
a plurality of light emitting members disposed in equally spaced relation to each other on said board over the whole region of said liquid crystal panel, at least three of said light emitting members being disposed side by side in equally spaced relationship to each other within a space partitioned by said partitioning reflection plate, said at least three light emitting members extending perpendicularly to a longitudinal direction of the space partitioned by said partitioning reflection plate, each of said light emitting members comprising an incandescent lamp.

2. A liquid crystal panel display device according to claim 1, wherein said at least three incandescent lamps are disposed perpendicularly to the longitudinal direction of each space partitioned by said partitioning reflection plate corresponding to each of said at least two display blocks.

3. A liquid crystal panel display device according to claim 1, wherein each of said at least two display blocks displays a different driving condition for a vehicle, said liquid crystal panel being a transmission type panel, and said display device being mountable on an instrument panel of the vehicle.

4. A liquid crystal panel display device according to claim 1, wherein said board comprises a printed circuit board, one of the surfaces thereof opposing said liquid crystal panel being colored white.

* * * * *